(12) United States Patent
Chan et al.

(10) Patent No.: US 7,501,839 B2
(45) Date of Patent: Mar. 10, 2009

(54) INTERPOSER AND TEST ASSEMBLY FOR TESTING ELECTRONIC DEVICES

(75) Inventors: Benson Chan, Vestal, NY (US); Frank D. Egitto, Binghamton, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 11/607,973

(22) Filed: Dec. 4, 2006

(65) Prior Publication Data

US 2007/0075726 A1    Apr. 5, 2007

Related U.S. Application Data

(63) Continuation-in-part of application No. 11/110,901, filed on Apr. 21, 2005, now Pat. No. 7,292,055.

(51) Int. Cl.
    *G01R 31/02* (2006.01)
(52) U.S. Cl. .......... 324/754; 324/757; 324/761
(58) Field of Classification Search ........ None
    See application file for complete search history.

(56) References Cited

U.S. PATENT DOCUMENTS

| | | | |
|---|---|---|---|
| 4,105,970 A | 8/1978 | Katz | |
| 4,476,433 A | 10/1984 | Logan | |
| 4,548,451 A | 10/1985 | Benarr et al. | |
| 5,177,436 A | 1/1993 | Lee | |
| 5,207,585 A | 5/1993 | Byrnes et al. | |
| 5,391,995 A | 2/1995 | Johnston et al. | |
| 5,477,161 A | 12/1995 | Kardos et al. | |
| 5,493,237 A | 2/1996 | Volz et al. | |
| 5,528,159 A | 6/1996 | Charlton et al. | |
| 5,532,612 A | 7/1996 | Liang | |
| 5,559,445 A | 9/1996 | Eaddy et al. | |
| 5,641,945 A | 6/1997 | Abe et al. | |
| 5,701,085 A | 12/1997 | Malladi et al. | |
| 5,828,226 A * | 10/1998 | Higgins et al. | 324/762 |
| 5,880,590 A | 3/1999 | Desai et al. | |
| 5,896,037 A | 4/1999 | Kudla et al. | |
| 6,051,982 A | 4/2000 | Alcoe et al. | |
| 6,156,484 A | 12/2000 | Bassous et al. | |
| 6,204,681 B1 * | 3/2001 | Nagatsuka et al. | 324/761 |
| 6,309,915 B1 | 10/2001 | Distefano | |
| 6,333,563 B1 | 12/2001 | Jackson et al. | |
| 6,383,005 B2 | 5/2002 | Ho et al. | |
| 6,521,530 B2 * | 2/2003 | Peters et al. | 438/667 |
| 6,529,022 B2 | 3/2003 | Pierce | |
| 6,727,717 B2 | 4/2004 | Kim et al. | |
| 6,905,589 B2 | 6/2005 | Egitto et al. | |
| 7,145,354 B2 * | 12/2006 | Stillman | 324/754 |
| 2006/0001439 A1 | 1/2006 | Akram et al. | |
| 2006/0033516 A1 | 2/2006 | Rincon et al. | |
| 2006/0091535 A1 | 5/2006 | Tsao et al. | |
| 2006/0108679 A1 | 5/2006 | Hauser et al. | |

* cited by examiner

*Primary Examiner*—Minh N Tang
(74) *Attorney, Agent, or Firm*—Hinman, Howard & Kattell; Mark Levy; Lawrence Fraley

(57) ABSTRACT

A test apparatus which uses a pair of substrates and housing to interconnect a host substrate (e.g., PCB) to an electronic device (e.g., semiconductor chip) to accomplish testing of the device. The apparatus includes a housing designed for being positioned on the PCB and have one of the substrates oriented therein during device engagement. The engaging contacts of the upper (second) substrate are sculpted to assure effective chip connection.

22 Claims, 2 Drawing Sheets

INTERPOSER AND TEST ASSEMBLY FOR TESTING ELECTRONIC DEVICES

CROSS REFERENCE TO CO-PENDING APPLICATION

U.S. Pat. No. 7,292,055 entitled "Interposer For Use With Test Apparatus And Method Of Making Said Interposer" (inventors: F. Egitto et al), an interposer is disclosed comprising at least two dielectric layers bonded to each other, sandwiching a plurality of conductors there-between. The conductors each electrically couple a respective pair of opposed electrical contacts formed within and protruding from openings with the dielectric layers. The interposer is ideally suited for use as part of a test apparatus to interconnect highly dense patterns of solder ball contacts of a semiconductor chip to lesser dense arrays of contacts on the apparatus's printed circuit board. The interposer is also capable of being used for other purposes, including as an interconnecting circuitized substrate between a semiconductor chip and a chip carrier substrate or between a chip carrier and a printed circuit board. Various methods of making such an interposer are also provided. U.S. Pat. No. 7,292,055 is assigned to the same Assignee as the instant invention.

The present application is a continuation-in-part of Ser. No. 11/110,901 filed Apr. 21, 2005 now U.S. Pat. No. 7,292,055.

TECHNICAL FIELD

The invention relates to test assemblies for testing electronic devices such as semiconductor chips and particularly to interposers for interconnecting such devices to a circuitized substrate such as a printed circuit board whereupon a series of electrical tests may be performed on the device.

BACKGROUND OF THE INVENTION

Semiconductor chips are typically fabricated by forming an array of chips on silicon wafers and dicing the wafer to produce individual chips. The individual chips are then attached to chip carriers, ceramic or organic modules or circuit boards using various techniques, the most common methods including solder reflow or wire bonding. One well known solder technique uses the reflow of lead-tin solder bumps (also known as C4 or controlled collapse chip connection bonding) formed on the chip pads at wafer level to attach the chip. The technique known as wire bonding or tape automated bonding (TAB) may be done by etching bumps on the leads or applying bumps (typically aluminum) to the chips. It is understood in the industry that when reference is made to bumped chips, it usually refers to lead-tin solder bumps, or TAB bumped chips. The bumped chips may be mounted to carriers either individually (single chip modules) or in groups (multi-chip modules).

Test apparatus (assemblies) for electronic devices such as semiconductor chips typically takes the form of an array of test probes which align with the array of electrical contact points on the device to be tested. These probe arrangements, however, have limitations, including, for example, a physical limitation due to the size differential between the relatively less dense pattern of contacts or conductors of the printed circuit board used for electrical testing and the higher dense pattern of contact sites (contacts) on the semiconductor chip. Because of this differential, there is a need to "fan out" the circuit lines in the interposer from the higher density chip contact location to the less dense contact location of the underlying circuitized substrate, such as a printed circuit board (hereinafter also referred to as a PCB). Thus, with the increasing density of contacts on chips, for example, it becomes more and more difficult to fabricate probe arrays with probe densities adequate to make proper electrical connection to a chip, wafer or substrate. Another limitation to known probe arrangements resides in the limitations on the clock speed of such connections. Typically, the clock speed of such arrangements is limited to no more than around 400 MHz. Yet another limitation, related to the first above, is the limited space for each of the test probes to effectively engage the respective contact on the device. Finally, yet another limitation is the need to be able to effectively orient the interposer on the test PCB with sound contact to the PCB's upper surface conductors.

Examples of various testing assemblies and other interposer and the like structures are described and illustrated in the following documents. The listing thereof is not an admission that any are prior art to the present invention.

In Published Patent Application 2006/0108679, there is described the fabrication and testing of a chip with a package having connecting pins as well as mounting the package on a board. In order to combine the advantages of a package with inline connecting pins with the advantages of a package with offset connecting pins, the package is fabricated with inline connecting pins and inserted into a test socket for testing. Immediately before mounting on the board, at least one connecting pin, preferably every second connecting pin, of the package is bent inward by a bending tool so as to achieve an offset arrangement of the connecting pins. The package is preferably mounted on the board using the bending tool. A test socket is sufficient for the purpose of testing the chip. A guide brace, for example, is suitable as a packaging means. This document states that since every second connecting pin is not bent inward immediately before insertion of the connecting pins, no subsequent corrective alignment of the offset connecting pins is required.

In Published Patent Application 2006/0091535 there is described a bonding pad formed on an IC (integrated circuit) chip for electrically coupling the chip to another device or component, and associated methods of manufacturing the bonding pad. In one embodiment, the bonding pad comprises a bonding portion having a bonding surface configured to receive an electrical connector. The bonding pad further comprises a probing portion having a probing surface adjacent and electrically coupled to the bonding surface, and configured to receive a probe tip for testing to the operation of the chip. In this embodiment, the bonding pad comprises a first planar dimension measured across the bonding portion and the adjacent probing portion, where the bonding portion further comprises a second planar dimension measured substantially perpendicular to the first planar dimension, and the probing portion comprises a third planar dimension measured substantially perpendicular to the first planar dimension and being less than the second planar dimension.

In Published Patent Application 2006/0001439, there is described an "interconnect" for testing semiconductor components which includes a substrate, and interconnect contacts on the substrate for electrically engaging terminal contacts on the components. This "interconnect" also includes one or more cavities in the substrate which form flexible segments proximate to the interconnect contacts. The flexible segments permit the interconnect contacts to move independently in the z-direction to accommodate variations in the height and planarity of the terminal contacts. In addition, the cavities can be pressurized, or alternately filled with a polymer material, to adjust a compliancy of the flexible segments. Different embodiments of the interconnect contacts include: metallized recesses for retaining the terminal contacts, metallized projections for penetrating the terminal contacts, metallized recesses with penetrating projections, and leads contained on a polymer tape and cantilevered over metallized recesses. The interconnect can be used to construct a wafer level test system for testing wafer sized components, such as wafers and boards, or to construct a die level test system for testing die sized components, such as unpackaged dice and chip scale packages.

In Published Patent Application 2006/0033516, there is described a probe card assemblage for simultaneously testing one or more integrated circuit chips including an interposer having on one surface a plurality of protruding contact elements for electrically contacting one or more chips of a wafer positioned atop a layer of compliant material, and arrayed in a pattern corresponding to an array of chip pads, a series of conductive vias through the electrically insulating interposer which connect the chip contact elements with an arrangement of leads terminating in a universal arrangement of connectors on the second surface, and a probe card with connectors mating to those on the interposer. The connectors on the interposer are secured to those on the probe card, thereby providing a vertical probe assemblage which makes use of ultrasonic energy to minimize scrub or over travel. The universal probe card is specific to a tester configuration and common to a family of circuits to be tested.

In U.S. Pat. No. 6,905,589, there is described a method of making a circuitized substrate in which a commoning layer is used to form multiple, substantially vertically aligned conductive openings in a multilayered component such as a laminate interposer for coupling a chip to a printed circuit board or the like. The structure, including such a chip and circuit board is ideally suited for use within an information handling system In U.S. Pat. No. 6,727,717, there is described an apparatus for testing an integrated circuit chip which includes a printed circuit device having connector pads, contacts, and traces extending between at least some of the connector pads and the contacts. The printed circuit device has openings therethrough, intersecting the contacts, that are adapted to receive the pins extending from the integrated circuit chip so that the contacts may electrically contact the pins. The apparatus further includes a connector electrically interconnected with at least some of the connector pads. The apparatus is adapted to be disposed between the integrated circuit chip and a chip socket, such that the pins extending from the integrated circuit chip may be inserted through the printed circuit device and into the chip socket.

In U.S. Pat. No. 6,529,022, there is described a wafer testing interposer. The interposer comprises a support having an upper and a lower surface. One or more solder bumps are on the lower surface. One or more first electrical terminals are on the upper surface, substantially corresponding to the position of the solder bumps, and forming a pattern. One or more first electrical pathways pass through the surface of the support and connect the solder bumps to the first electrical terminals. One or more second electrical terminals are on the upper surface of the support. The second electrical terminals are larger in size and pitch than the first electrical terminals, and these are located within the pattern formed by the first electrical terminals. One or more second electrical pathways connect the first electrical pathways to the second electrical pathways.

In U.S. Pat. No. 6,383,005, there is described an integrated circuit socket having a contact pad. The integrated circuit socket includes a base unit, consisting of a base, contact pins and an elastomer. The contact pins provide electrical contact of the other elements and the elastomer provides the compactness of the assembly. The socket further includes an interposer, consisting of a flexible film, a stiffener and a stop layer wherein the contact pad of the flexible film may contact with the solder ball of the IC device to buffer the pressure formed by a tight contact when the IC device is moving downward. The socket also consists of an adapter unit and a cover.

In U.S. Pat. No. 6,333,563, there is described an electrical interconnection package and a method for using same which allegedly increases the fatigue life of a Ball Grid Array (BGA) electrical interconnection. (Such BGAs include, understandably, solder balls of the type mentioned above, and interconnect components of the type also mentioned above.). This described structure includes an organic interposer using a high modulus under-fill material to couple an electronic "module." The organic interposer is then joined to an organic board (PCB) using standard joining processes. The "module" can be removed from the organic board at any time by removing the organic interposer using standard rework techniques.

In U.S. Pat. No. 6,309,915, there is described a method of making a semiconductor chip assembly, including providing a dielectric element with a plurality of electrically conductive terminals, disposing an expander ring over the dielectric element so that a semiconductor chip on the dielectric layer is disposed in a central opening in the expander ring, and disposing an encapsulant in the gap between the expander ring and the semiconductor chip. The size of the gap is controlled to minimize the pressure exerted on the leads by the elastomer as it expands and contracts in response to changes in temperature. The semiconductor chip and expander ring may also be connected to a heat sink or thermal spreader with a compliant adhesive.

In U.S. Pat. No. 6,156,484, there is described a sculpted probe pad and a gray scale etching process for making arrays of such probe pads on a thin flexible interposer for testing the electrical integrity of microelectronic devices at terminal metallurgy. Also used in the etching process is a fixture for holding the substrate and a mask for single step photolithographic exposure. The result is an array of test probes of pre-selected uniform topography, which make contact at all points to be tested simultaneously and nondestructively. The pad is retained within a dielectric body and includes a "domed" portion and an opposing "sculpted" portion which is formed using etching, resulting in "features" having "sculpted" areas. Both portions are part of an integral structure, such that these are of a single metallic body and arranged in an opposing orientation with one portion being directly opposite the other.

In U.S. Pat. No. 6,051,982, there is described a test apparatus including at least one probe member precisely aligned using two spaced apart means (e.g., thin layers) such that the probe can effectively engage a conductor (e.g., solder ball) on an electronic module (e.g., ball grid array package). A compressible member (e.g., elastomeric body) is used to bias the probe toward the conductor. Various probe cross-sectional configurations are also provided. As taught herein, the probe electrically contacts one of the spaced apart means, also conductive, to thus form a circuit which can extend externally of the apparatus (e.g., for connecting to appropriate testing equipment).

In U.S. Pat. No. 5,896,037, there is described a test adapter for actively testing chip packages such as a ball grid array in operation with a printed circuit board. The test adapter provides accessible test points for monitoring input and output signals of an operating chip package. The adapter includes an interface adapter board having a plurality of contact pads disposed on its surface, in a pattern corresponding to the footprint of the chip package. A plurality of contact terminals protrude from the bottom of the interface adapter board and are connected to the contact pads on the upper surface, and are configured to engage a receiving socket mounted to a printed circuit board. A plurality of test pins are also connected to the contact pins such that test probes can be connected to the test pins and the input/output signals associated with the chip package can be monitored by the probes.

In U.S. Pat. No. 5,880,590, there is described an apparatus for providing temporary connections to a flip-chip style chip having solder bumps or pre-forms protruding therefrom for testing and bum-in while avoiding distortion of the bumps or pre-forms and avoiding wear and damage to a test or bum-in jig such as a ball grid array. The apparatus uses a resilient bucketed interposer which includes recesses which have a depth greater than the protrusion of the solder bumps or pre-forms and, preferably are narrowed at one side to a teardrop shape. Metallization in the recesses and contacts on the interposer which mate with the jig are preferably textured with dendrites to be self-cleaning. A beveled tongue and groove arrangement translates a slight compressive force to a slight shearing force between the interposer and the chip to ensure good connections to the protruding solder bumps on the chip. Any deformation of the bumps thus tends to only improve accuracy of positioning of the bumps and avoids solder voiding due to compression distortion. Full bum-in and functional testing can then identify "known good" chips or dies before package completion, particularly to avoid rework of modular circuit packages.

In U.S. Pat. No. 5,701,085, there is described an apparatus for use in testing wire-bond or flip-chip connected integrated circuits which includes a housing with a top side, a bottom side, and a perimeter region defining a housing central aperture. The housing further includes flip-chip pads to accommodate flip-chip solder connections to a flip-chip integrated circuit during a first test period and wire-bond pads to accommodate wire-bond connections to a wire-bond integrated circuit during a second test period. There are connector pins on the bottom side of the housing for connection with a printed circuit board. The printed circuit board includes an access aperture which is aligned with the housing central aperture. This configuration allows a test probe to access a flip-chip integrated circuit positioned within the housing. It also allows a heat sink to be used when the housing incorporates a wire-bonded integrated circuit.

In U.S. Pat. No. 5,641,945, there is described a contacting structure with respect to a spherical bump in which the spherical bump is to be contacted with a contact pin, the contact pin including a contacting portion supported by a resilient support element. The contacting portion is arranged in opposite relation to that part of a spherical surface of the spherical bump other than a lower-most point thereof. The contacting portion has a projection capable of pressing into the spherical surface of the spherical bump, and also has a pressure receiving surface for setting an amount by which the projection presses into the spherical surface.

In U.S. Pat. No. 5,559,445, there is described an IC test adapter for adapting the pin configuration of a chip carrier for use with test equipment. The IC test adapter includes a case, printed circuit board, electrical contact pad, pin grid array and bracket.

In U.S. Pat. No. 5,532,612, there are described methods and reusable test carriers which provide for bum-in test of semiconductor integrated circuit devices. Methods for temporary flip-chip mounting of IC wafers or dice (chips) use a hierarchy of solder melting points in combination with improved reusable carrier substrates. IC chip wafers having high-melting-temperature flip-chip terminals are coated with a predetermined volume of a sacrificial solder having a significantly lower melting temperature. A reusable temporary carrier is provided, in a range of sizes adapted for a wafer, small numbers of IC dice, or an individual die. For full-wafer bum-in, the reusable carrier has edge connector terminals. For testing individual dice or a small number of dice, the reusable carrier has conductive elements in a pattern matching each IC die's terminal pattern. The same or opposite side of the reusable carrier has pins or a ball-grid array matching a conventional bum-in socket. A preferred reusable carrier consists of separable parts: a substrate customized to carry specific dice for burn-in, and a "universal" carrier package adapted to fit standard test sockets. After burn-in testing, the known good dice are removed by a low-temperature reflow, and attached to permanent substrates by conventional high-temperature reflow. The test carriers are re-usable after cleaning. A carrier structure similar to the preferred separable structure is specially adapted for testing and/or permanent packaging of IC chips which utilize wire-bond connections.

In U.S. Pat. No. 5,528,159, there is described a method and apparatus for testing semi-conductor chips which include Input/Output (I/O) contacts. The apparatus is provided with an interposer that has contacts corresponding to the contacts on the semiconductor chip. Both the chip and the interposer contacts can be any known type including metal ball, bumps, or tabs or may be provided with dendritic surfaces. The chip contacts are first brought into relatively loose temporary contact with the contacts on the interposer and then a compressive force greater that five grams per chip contact is applied to the chip to force the chip contacts into good electrical contact with the interposer contacts. Testing of the chip is then performed. The tests may include heating of the chip as well as the application of signals to the chip contacts. After testing, the chip is removed from the substrate.

In U.S. Pat. No. 5,493,237, there is described a testing apparatus, preferably an LGA (land grid array) bum-in test socket, for an integrated chip. The apparatus, arranged for mounting on a planar electronic device, such as a printed circuit board, includes a frame member for mounting to the planar electronic device, where the frame member includes a central opening extending between first and second surfaces, and dimensionally sized to receive the chip. Recesses are provided for receiving an electronic interface member mounting plural flexible electrical connectors, such as an elastomeric connector, as known in the art, for engaging the traces or pads of the chip to the planar device during testing. Further, plural recesses extend from at least the first surface, where each recess includes a compression spring. Positioned over and for engagement with the frame member is a floatably mounted force applying member having first and second parallel surfaces. A central opening, concentric with the central opening of the frame member is present. Additionally, plural posts extend from the second parallel surface for receipt in respective recesses. Finally, camming levers are provided for urging the force applying member toward the frame member, along with pivotal pusher members responsive to the camming levers to engage and secure the chip during testing thereof.

In U.S. Pat. No. 5,477,161, there is described a test clip, or test adapter, for connecting leads of a tester to terminals on a packaged integrated circuit. Spacers on the test clip, which act to precisely separate the contact pins, are formed separately using a stamping process. Spacers may be formed having a thickness which can be controlled to approximately one mil.

Each of the individual spacers is sandwiched between two contact pins to provide precise spacing of the contact pins. A bar is inserted through a hole in each of the spacers and contact pins to form a linear array of contact pins and spacers. Two or four (as appropriate) of the linear arrays of contact pins/spacers are then mounted on a test clip body sized for a specific integrated circuit package. Each of the spacers may include an L-shaped extension which is urged under the integrated circuit package when the test clip is pressed onto the package so as to firmly secure the test clip to the package.

In U.S. Pat. No. 5,391,995, there is described a spring biased test probe for testing electrical printed circuit boards which includes an elongated tubular barrel having an open end, and a compression spring within a spring seating end of the barrel, opposite from its open end. A plunger inserted in the barrel reciprocates during testing, sliding within the barrel and biased by the spring pressure. The plunger includes a forward end portion outside the barrel, a slidable tail portion that contacts the spring and slides within a barrel, and an intermediate twisted portion between the forward end and the tail portion of the plunger. The forward end of the plunger has a probe tip configured to make frictional pressure contact with the board to be tested. The intermediate portion is twisted about its axis to form a spiral with helical grooves contacted by circumferentially spaced apart crimps in the side of the barrel, adjacent the open end of the barrel. The plunger is rotated about its axis by its contact with the crimps as the plunger travels axially in the barrel. The twisted intermediate section of the plunger and the forward end of the plunger extend outside the barrel which is contained in an elongated tubular outer receptacle. The forward end of the plunger includes an elongated enlarged diameter guide bearing section between the probe tip and the twisted section of the plunger.

In U.S. Pat. No. 5,207,585, there is described a thin interface pellicle probe for making temporary or permanent interconnections to pads or bumps on a semiconductor device wherein the pads or bumps may be arranged in high density patterns. The electrode for each pad or bump has a raised portion for penetrating the surface of the pad or bump to create sidewalls to provide a clean contact surface. The electrode also has a recessed surface to limit the penetration of the raised portion. The electrodes may be affixed to a thin flexible membrane to permit each contact to have independent movement over a limited distance and of a limited rotation. In one embodiment (FIG. 22), the electrode's opposing ends are offset from one another to permit the electrode to "rotate" slightly when force is applied, resulting in a desired wiping engagement.

In U.S. Pat. No. 5,177,436, there is described a test fixture for receiving an integrated circuit chip mounted in a carrier package and for providing contacts with electrical conductor pads of the package to facilitate electrical testing thereof. The test fixture comprises a plurality of contact members mounted to a spring-loaded plunger. Each contact member includes a strip of conductive fingers with protruding contacts for springing engagement with the conductor pads of the carrier when the plunger is depressed. The test fixture resides in a cavity of a housing unit and is aligned with a central aperture therein. In operation, a ram holding the carrier lowers it through the central aperture of the housing unit and onto the plunger. The carrier is then pressed against the plunger, causing it to depress. This allows the carrier conductor pads to frictionally engage the protruding contacts of the conductive fingers, thus effectuating electrical contact.

In U.S. Pat. No. 4,548,451, there is described a pinless connector interposer for making densely populated, inexpensive, simple, reliable, self-wiping connections between components used in semiconductor packaging such as semiconductor carrying substrates, flexible and rigid printed circuit boards and cards. The connector interposer comprises an elastomeric base member in which deformable protrusions are formed on both the top and bottom surface of the base member, wherein the protrusions correspond to contact pads of semiconductor packaging components. An electrically conductive metal coated flexible overlay is bonded to the base member, forming electrically conductive tab elements, enabling a multitude of connections to be made to a semiconductor package.

In U.S. Pat. No. 4,476,433, there is described a continuity testing fixture for simultaneously probing of microelectronic chip site pads having a cluster of probe pins extending from a top plate in the same orientation as the pads. The probe pins are individually urged into compliance by a resilient pad disposed beneath the pins forcing a sharp end into contiguous engagement and allowing an external signal to determine continuity of the work-piece. Individual insulated wires are attached to each probe on one end and are encompassed within a cavity in the body terminating at a connector near the edge of the fixture for linking to the remote test source. In another embodiment, the probe pins are hollow and contain an insulated wire allowing an independent signal to be introduced by way of the connector through the pads indicating both compliance of the probe and continuity of the workpiece simultaneously and independently.

In U.S. Pat. No. 4,105,970, there is described an electrical testing pin characterized by a crown with an inner contact area and a plurality of outer contact areas, the former extending longitudinally beyond the latter. The pin includes a crown with a multiplicity of spaced sharp contacts including a central sharp contact and a multiplicity of sharp contacts spaced there-around in a contact set, each contact of the set being separated from adjacent contacts by continuous radial grooves extending uninterruptedly at an angle to define two of the sharp contacts of the set and also to allow for self-cleaning.

As defined herein-below, the present invention represents an improvement in the testing of semiconductor chips by providing an interposer which operates in an effective manner to interconnect the higher density pattern of chip contact sites to the less dense pattern of conductors on a printed circuit board such that the board can then be utilized to provide test signals and effectively test the chip. The interposer may be removably positioned on the board and thus usable with other boards, as well as other chips. Other advantageous features of this invention are discernible from the teachings below. It is believed that such an invention will represent a significant advancement in the art.

OBJECTS AND SUMMARY OF THE INVENTION

It is, therefore, a primary object of the present invention to enhance the art of testing semiconductor chips.

It is another object of the invention to provide an improved interposer structure adaptable for use between at least one chip (and possibly a wafer of same) and a printed circuit board.

It is yet another object of the invention to provide such a structure which is compressible, thereby accommodating for non-planarity of the chip and/or printed circuit board contacts to thus assure that a sound connection is completed to all such contacts.

It is still another object of the invention to provide a test assembly which is capable of utilizing the interposer defined herein as part thereof.

According to one aspect of the invention, there is provided an interposer for interconnecting an electronic device and a circuitized substrate, the interposer comprising a housing adapted for being positioned on a host circuitized substrate including a plurality of host conductor pads, a first circuitized substrate movably positioned within the housing and including a plurality of contact pads of a first density, selected ones of the plurality of contact pads of the first circuitized substrate adapted for engaging respective ones of the host conductor pads of the host circuitized substrate, and a second circuitized substrate positioned on the first circuitized substrate and electrically coupled thereto. The second circuitized substrate is adapted for engaging an electronic device including a plurality of contact sites thereon of a second density different than the first density of the plurality of contact pads of the first circuitized substrate, the second circuitized substrate including a plurality of contact members of a density similar to the second density of the electronic device. Selected ones of the plurality of contact members of the second circuitized substrate are adapted for engaging respective ones of the contact sites of the electronic device when the electronic device is positioned on the second circuitized substrate, the first circuitized substrate including a plurality of conductive lines therein which intercouple the selected ones of the plurality of contact pads of the first circuitized substrate to the selected ones of the plurality of contact members of the second circuitized substrate.

According to another aspect of the invention, there is provided a test assembly for testing an electronic device, this test assembly comprising a host circuitized substrate including a plurality of host conductor pads, a housing positioned on the host circuitized substrate substantially over the plurality of host conductor pads, a first circuitized substrate movably positioned within the housing and including a plurality of contact pads of a first density, selected ones of this plurality of contact pads of the first circuitized substrate adapted for engaging respective ones of the host conductor pads of the host circuitized substrate, and a second circuitized substrate positioned on the first circuitized substrate and electrically coupled thereto. The second circuitized substrate is adapted for engaging an electronic device including a plurality of contact sites thereon of a second density different than the first density of the contact pads of the first circuitized substrate, this second circuitized substrate including a plurality of contact members of a density similar to the second density of the electronic device. Selected ones of the contact members of the second circuitized substrate are adapted for engaging respective ones of the contact sites of the electronic device when the electronic device is positioned on the second circuitized substrate. The first circuitized substrate includes a plurality of conductive lines therein which intercouple the selected ones of the plurality of contact pads of the first circuitized substrate to the selected ones of the plurality of contact members of the second circuitized substrate such that testing of the electronic device may occur while the electronic device is positioned on the second circuitized substrate and the test assembly is in operation.

BEST MODE FOR CARRYING OUT THE INVENTION

Figure 1:
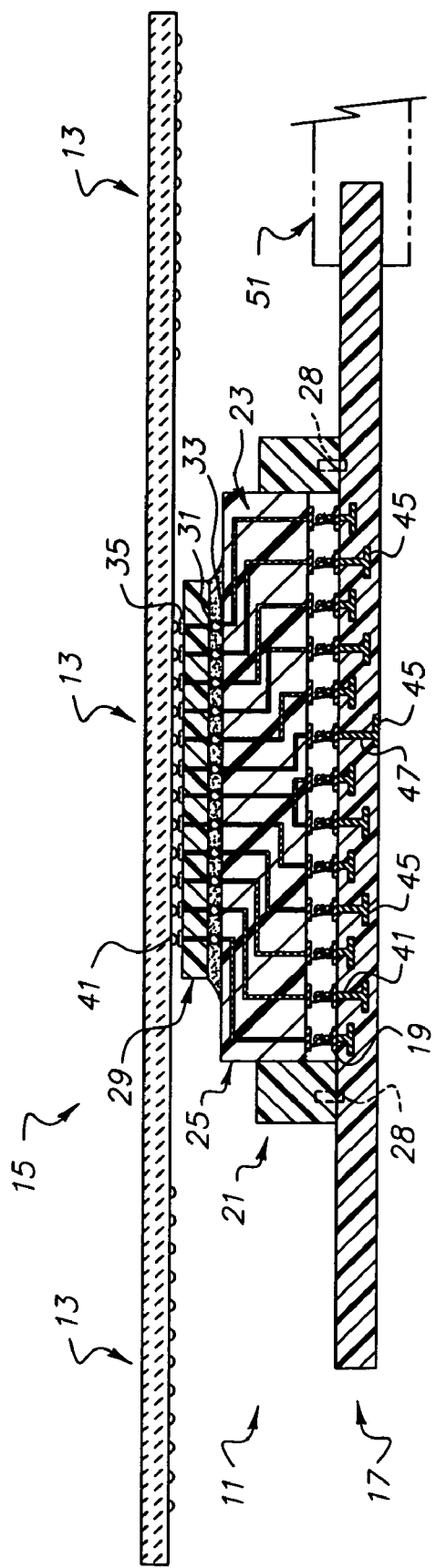
FIG. 1 is a side elevational view, partly in section, illustrating a test assembly and an interposer, each according to one embodiment of the invention.

For a better understanding of the present invention, together with other objects, advantages and capabilities thereof, reference is made to the following disclosure and appended claims in connection with the above-described drawings. It is understood that like numerals will be used to indicate like elements in the FIGS. presented.

By the term "circuitized substrate" as used herein is meant to include a substrate which includes at least one dielectric layer and a plurality of internal conductive lines which function to interconnect selected ones of a plurality of conductors on one side of the substrate with those on an opposite side. Examples of dielectric materials include such materials as fiberglass-reinforced epoxy resins (some referred to as "FR-4" dielectric materials in the art), polytetrafluoroethylene (PTFE, one example being Teflon, a well known product sold by E.I. duPont deNemours & Company, also the owner of this trademark), polyimides, polyamides, cyanate resins, polyphenylene ether resins, liquid crystal polymers (LCP's), photoimageable materials, and other like materials. The interim conductive lines and the metal for the metallic conductors are preferably of an excellent conductor such as copper, but other metals (e.g., nickel and/or gold) may then be added as well, for finish and/or enhanced conductivity purposes. If the dielectric materials for the structure are of a photoimageable material, this material may be photo-imaged (or photo-patterned), and developed to reveal the desired pattern of openings. The dielectric material may be curtain-coated, spin-coated or screen- applied, or it may be supplied as dry film. Final cure of the photoimageable material provides a toughened base of dielectric. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethyl-violet dye; 0.03% FC 430, a fluorinated polyether nonionic surfactant from the 3M Company, having a place of business at 305 Sawyer Ave. Tonawanda, N.Y.; and 3.85% Aerosil 380, an amorphous silicon dioxide from Degussa Corporation, having a business location at Interspace Parkway, Parsippany, N.J., to provide the solid content. A solvent is present from about 11 to about 13.5% of the total photo-imageable dielectric composition. The dielectric layers taught herein may be typically about 0.5 mils to about 4 mils thick, but may be thicker if desired.

By the term "interposer" as used herein is meant to include a structure capable of electrically interconnecting two opposed, spaced arrays of electrical contacts (conductors) found on such electronic devices as semiconductor chips with conductors found on such circuitized substrates as printed circuit boards. This is not meant to limit the invention, however, as the interposer formed in accordance with the teachings herein may be used for other interconnecting means, including, e.g., as a singular circuitized substrate to form an interconnection between two corresponding circuitized substrates such as a chip carrier and a printed circuit board (PCB). As defined herein, the invention is capable of interconnecting different types and shapes of electrical conductors, and is thus not limited to the types and shape mentioned immediately above. Such an interposer, as defined herein, includes at least two separate circuitized substrates adapted for being electrically coupled together, interconnecting contacts (e.g., solder balls) to form the couplings, and external conductors in the form of pads and the like on opposite sides of the dual substrate "sandwich."

By the term "sculpted" as used herein is meant a final external configuration of a metallic contact formed by etching (e.g., differential gray scale etching, such as described in U.S. Pat. No. 6,156,484) in which various designated surface areas are etched at different rates) to form the final, different final external configuration, or by forming a first external configuration (e.g., boxlike or cylindrical) which is then subjected to further processing (e.g., by gray scale etching, plating of dendritic structures, etc.). The final configuration will typically include grooves, slots or similar indentations therein. This definition is not meant to include a rounded domed shape or other shape having an entirely smooth, uninterrupted exterior surface. This contact, as understood from the following, is capable of penetrating, even if only partially, the surface of a contact such as a solidified solder ball.

Conductive thru-holes are known in the substrate art, and are often referred to as "buried vias" if internally located (entirely within the substrate's outer confines), "blind vias" if extending a predetermined depth within the substrate from an external surface, or "plated-thru-holes" (PTHs) if extending substantially through the substrate's full thickness. By the term "thru-hole" as used herein, therefore, is meant to include all three types of such substrate openings.

Figure 2:
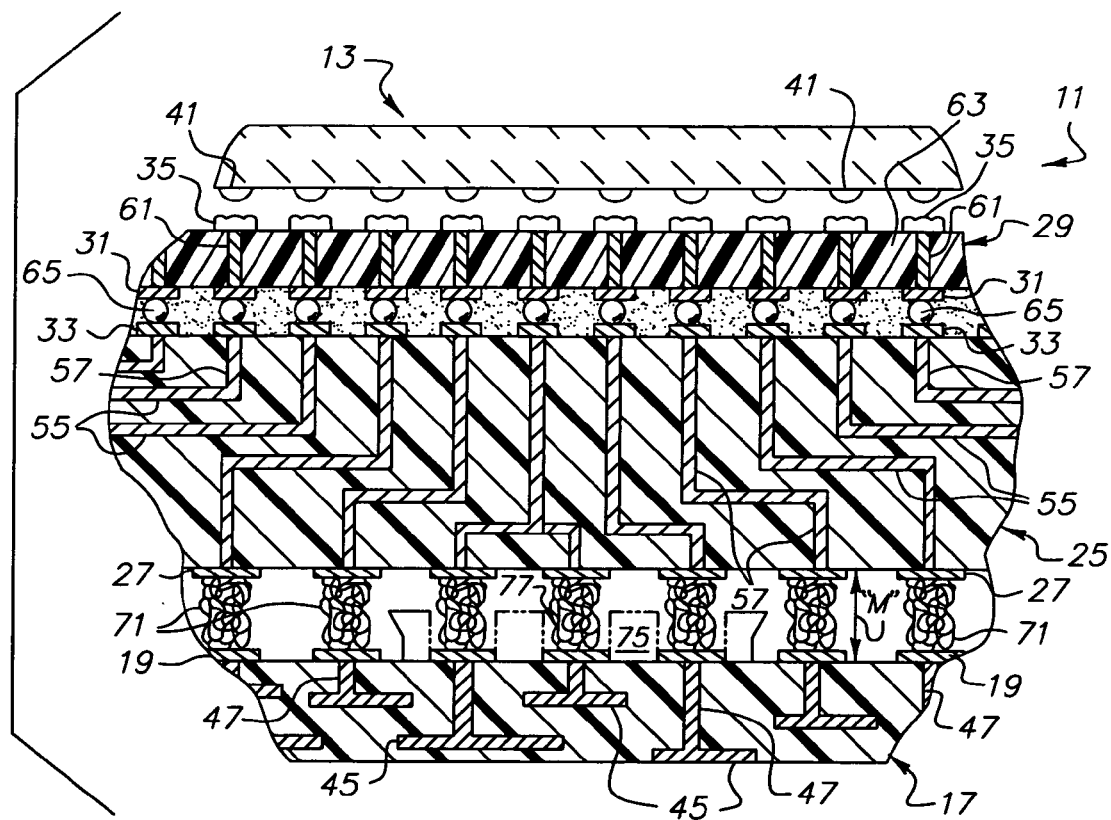
FIG. 2 is a partial view, in section and on an enlarged scale over the view of FIG. 1, illustrating selected elements of the test assembly and interposer of FIG. 1.

In FIG. 1, there is shown a test assembly 11 for testing an electronic device 13 such as one or more semiconductor chips on a large wafer 15. Three such devices (chips) 13 are shown, but understandably many more may form part of wafer 15. Assembly 11 includes a host circuitized substrate 17 (e.g., a printed circuit board) having a plurality of host conductor pads 19 on the upper surface thereof (see especially FIG. 2), and a housing 21 positioned on the host circuitized substrate 17 for substantially surrounding the plurality of host conductor pads 19. Housing 21 is preferably plastic (e.g., a highly-durable resin thermoplastic polycarbonate such as Lexan, a polyphenylene sulfide (PPS) such as Ryton), or a liquid crystal polymer (LCP) and includes an open portion (cavity) 23 therein designed to accommodate a first circuitized substrate 25 which also forms part of assembly 11. (Lexan and Ryton are trademarks of the General Electric Company and Chevron Phillips Chemical Company, respectively.) Cavity 23 is preferably of rectangular configuration when viewed from the top of housing 21. Substrate 25, preferably a multi-layered printed circuit board as defined in greater detail below, is movably positioned within the housing and includes a first plurality of contact pads 27 (see especially FIG. 2) on the undersurface thereof. Pads 27 are arranged in a pattern of a first density similar to that of the corresponding pads 19 on substrate 17. As seen in FIGS. 1 and 2, selected ones of this first plurality of contact pads 27 of substrate 25 are adapted for engaging respective ones of the host conductor pads 19 when substrate 25 is fully positioned within housing 21. Housing 21 is preferably aligned relative to the underlying substrate 17 using a plurality of alignment pins 28, two of these being shown in phantom in FIG. 1. At least four such pins are preferably used, one at each of the corners of the rectangular shaped housing.

Assembly 11 further includes a second circuitized substrate 29 positioned on first circuitized substrate 25 and, as also defined in greater detail below, is electrically coupled thereto. Such coupling is achieved using a plurality of contact members 31 (FIG. 2) on the undersurface of substrate 29 which align with and couple to corresponding contact pads 33 on the upper surface of substrate 25, substantially opposite pads 27. Significantly, the pattern of contact members 31 is of a higher density (much more closely spaced (e.g., center-to-center, and, preferably, smaller in size) than the corresponding lower pads 27, while of a similar pattern as pads 33 to which these are coupled. Substrate 29, also preferably a printed circuit board but of much thinner construction than substrate 25, also includes a plurality of contact members 35 on its upper surface, opposite contact members 31 and of a similar pattern as same. Members 35 are designed for being electrically coupled to corresponding contact sites 41 on the undersurface of device 13 in order to accomplish the desired testing of device 13. Such testing occurs of course when the device is so positioned and appropriate test signals are provided from substrate 17 through the two substrates 25 and 29.

The defined two substrates 25 and 29, in combination with the defined housing, thus form an interposer which functions to interconnect an electronic device such as a semiconductor chip to a host substrate such as a printed circuit board (PCB) for test purposes. As understood from the description herein, the housing 21 is designed for being removably positioned (e.g., using clamps or screws) onto the host substrate, or even fixedly secured to the host, depending on customer requirements, once alignment using pins 28 has been attained. This is not meant to limit the scope of the invention, however, as it is possibly to more fixedly secure housing 21 and/or substrate 25 to substrate 17. One means of doing so could be to solder these components, such as soldering the underlying pads 27 of substrate 25 directly to the corresponding pads 19 of substrate 17. Housing 21 could also be soldered, e.g., if provided with some form of metallic undersurface and then soldering this to selected metallic portions on the upper surface of substrate 17. Adhesive could also be used for this purpose.

Pads 19, pads 27, contact members 31 and pads 33 are each preferably of copper or copper alloy material and of a substantially annular configuration. Other conductive materials and configurations are of course possible. In one embodiment, these elements are formed on the respective surfaces using conventional photolithographic processing known in the PCB art, and further description is not considered necessary. As seen in FIGS. 1 and 2, host substrate 17, preferably a multi-layered printed circuit board, further includes a plurality of conductive planes therein, each including one or more signal lines 45 designed for being electrically connected to corresponding, selected ones of pads 27. In one example, such connections are possible using thru-holes 47 (e.g., PTH's and "blind vias") of conventional PCB construction. The signal lines in turn are adapted for being electrically coupled to an external test apparatus (not shown) which provides the desired test signal patterns. Such connection is preferably accomplished using a conventional PCB connector 51 (shown in phantom in FIG. 1) which includes an end portion of substrate 17 coupled thereto (and, preferably, located therein). The conductive planes are also preferably copper or copper alloy and formed in accordance with conventional technologies, e.g., in a multi-layered structure such as substrate 17 (and substrate 25). Such conductive layers are typically formed (again, using photolithographic processing) on respective layers of dielectric material (such as defined above), and the formed "sub-layers" then aligned and bonded together using conventional PCB lamination processing. In one embodiment, substrate 17 may include twenty to forty conductive layers and a similar number of dielectric layers. Other combinations are of course possible. Likewise, first substrate 25 may include seven to fifteen conductive layers (identified by the numeral 55 in FIG. 2) and several thru-holes 57 arranged in a specific pattern (i.e., as shown) to interconnect pads 33 with the opposing pads 27 of lesser density. Because of this pattern density difference, layers 55 "fan out" from the corresponding upper pattern, as seen in both FIGS. 1 and 2, to align with the lower pattern. The thru-holes are strategically positioned at the respective ends (or close thereto) of the layers to then downwardly reach pads 27.

In the embodiment shown in greater detail in FIG. 2 than FIG. 1, each interconnection between an upper pad 33 and its corresponding lower pad 27 preferably includes at least one conductive plane 55 (e.g., which may comprise but a single signal line) and two thru-holes 57. This is not meant to limit the invention, because it may be possible to directly connect one or more pads 33 and pads 27 with a single thru-hole (a PTH). It is also possible for one pad 33 to couple to two or more pads 27 (one such possibility being shown near the center of the structure in FIG. 2) and vice-versa.

Second substrate 29, as shown, may be much thinner than first substrate 25, and, as shown, includes a plurality of conducting lines 61 which are vertically oriented within the substrate to directly connect selected ones of the upper contact members 35 with respective ones of the lower plurality of contact members 31. As shown, each contact member 35 is directly connected to a corresponding contact member 35. In one embodiment, conducting lines 61 are each comprised of a thru-hole, and preferably a PTH made using conventional laser drilling and plating technology. In this embodiment, substrate 29 is only about six mils thick while the corresponding lower substrate 25 is thirty mils thick. Each conducting line 61 is thus also only about six mils long, and extends from the upper to the lower surface of substrate 29. It is thus seen, especially in FIG. 2, that the contact members 35 and 31 are similar in number, pattern and density as are the corresponding contact sites 41 on the underside of device 13. Understandably, substrate 29 is allowed to be much thinner because the conducting lines 61 therein need not "fan out" to a less dense pattern. Substrate 29 may be comprised of a single layer 63 of dielectric material, which in turn is preferably comprised of an organic polymer material (examples of same including allylated polyphenylene ether (APPE) and polyimide, one example being Kapton polyimide film), including therein a quantity of silica particles. (Kapton is a trademark of E.I. duPont deNemours & Company). One example of such material is available from Asahi Chemical Company, having a business location at Sumikafudosan Yokobori Bldg. 9f. 4-6-17, Koraibashi, Japan, under the product name PC5103.). This or a similar material is preferred for at least two reasons: (1) to assure sufficient rigidity of the substrate during device engagement; and (2) to more closely approximate the coefficient of thermal expansion (CTE) of the device 13. Examples of dielectric material for the dielectric layers of substrate 25 include APPE, polytetrafluorethylene (PTFE), Driclad (Driclad is a registered trademark of the Assignee of this invention, Endicott Interconnect Technologies, Inc.), LCP, and ceramic, the preferred material being application dependent.

Figure 4:
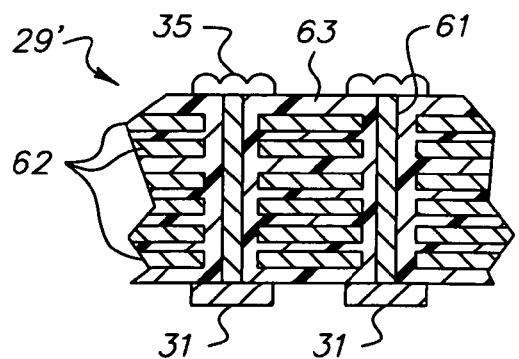
FIG. 4 is an enlarged, partial side elevational view of one embodiment of the second substrate of the invention.

As illustrated in FIG. 4, the upper substrate (referenced by the numeral 29') may be a multilayered structure, meaning it may include several dielectric and conductive layers as part thereof, arranged in a stacked orientation. Because one of the primary functions of this substrate is to provide a "pedestal" to allow clearance between the wafer (substrate 13) and substrate 25 so that adjacent chips are not touched and/or damaged during test, such a multilayered configuration is preferred to accomplish this. In addition, if decoupling capacitors or other elements are required on the surface of substrate 25, as is often necessary, this pedestal arrangement allows clearance for these devices as well. The internal conductive (e.g., copper) planes 62 (six are shown, but there may be more or less, depending on application requirements) enable connection of certain elements (using one or more of the thru-holes) to power or ground, as such internal conductive planes may provide such electrical capabilities. In addition, these metal planes add rigidity to the substrate in comparison to a single dielectric layered version as shown in FIGS. 1 and 2. With the additional metal planes 62, the CTE of substrate 29 may approach eighteen PPM/C (parts per million, per degree Celsius), or, nearly the same as that of the underlying substrate 25 (assuming substrate 25 is of an organic and copper construction such as defined above). Without the internal copper planes in substrate 29, the CTE will be relatively greater, perhaps as much as forty to fifty PPM/C.

Substrate 29 is coupled to substrate 25 using a plurality of interconnecting contacts 65, which in the embodiment shown, are solder balls, and in a more preferred embodiment, of 63:37 tin:lead composition with a melting point of about 179 degrees Celsius (C.). Coupling is achieved by depositing a quantity of solder atop each of the accommodating contact pads 33 and then re-flowing the solder (e.g., at a temperature of about 220 degrees C. in a standard convection oven) until the solder forms a substantially "ball-like" shape. The next step involves aligning the respective contact members 31 with respect to the formed solder elements, and a second re-flow operation occurs, at a temperature of about 220 degrees C. and, again, in a standard convection oven. The re-flowed solder forms the coupling between respective pairs of pads 33 and contact members 31. The re-flow operation, with the solder substantially in a liquidus state, also enables substrate 29 to be adjusted (e.g., tilted and/or moved laterally) to assure it aligns in a precise horizontal, planar orientation atop lower substrate 25 prior to the solder assuming a solid configuration. Such planarity is essential to assure effective coupling to the respective contact sites 41 of a typically, extremely thin semiconductor chip.

As stated, substrate 25 is positioned within housing 21, such that it may move vertically therein (noted by arrow "M") during engagement with device 13. That is, engagement by device 13 allows the substrate 25 to be downwardly depressed within housing 21, this movement being substantially perpendicular to the plane of the device. Substrate 25 is positioned in a relatively tight, albeit slidable, manner within housing 21, to thereby prevent unacceptable tilting of the substrate and thereby further assure that device contact sites 41 and upper contact members 35 will remain firmly engaged at all times during device testing. Thus, friction created by such movement is minimal. This is very important, considering the extremely compact, highly dense patterns of such conductors and the ready possibility for misalignment and resulting disconnection.

To allow movement between host substrate 17 and first substrate 25, a plurality of compressible mesh contacts 71 are used. Each contact 71 comprises a quantity of fine wire which may be secured at one end to a respective conductor pad 19 on substrate 17 and/or a corresponding contact pad 27 on the underside of substrate 25. For example, each mesh wire may be soldered to either or both of such conductors. Examples of such mesh-type contacts capable of being used with the invention include the "CIN:APSE" contact, available from Cinch Connectors, having a place of business at 1700 Finley Road, Lombard, Ill., and the "Fuzz Button" contact available from Tecknit Interconnection Products, having a place of business at 129 Dermody Street, Cranford, N.J.). The CIN:: APSE contact is a Z-axis compression contact which consists of randomly wound gold plated molybdenum wire, formed into a cylindrical shape. Standard contact diameters are 0.020" (0.508 mm) and 0.040" (1.016 mm). This contact allows for high signal speed capability, enabling frequencies greater than twenty GHz. The standard Fuzz Button contact is manufactured from a single strand of 0.002" gold plated beryllium copper wire, die compressed into a cylindrical shape. The buttons offer the excellent electrical and spring characteristics inherent to beryllium copper. Standard Fuzz Button contacts are rated to approximately 110 degrees C., but if a higher temperature is required, other materials such as gold plated tungsten (130 degrees C.) or gold plated nickel chromium (150 deg C.) wire may be substituted. The contact comprises a wire mass having spring performance and demonstrated superior electrical signal conduction from high current direct current to microwave frequencies. Typical size is 0.010" in diameter by 0.060" in length. Fuzz Button contacts provide reduced signal path lengths, relatively low inductance and reduced electrical distortion. In addition, the random wire orientation of each Fuzz Button contact plays a role in the cancellation of electronic fields created by electrical conduction. These two contacts are not meant to limit the scope of the invention as other compressible contacts may also be utilized, including those compressible contacts of more recent vintage from both Cinch Connectors and Tecknit Interconnect Products.

As an alternative to the above, housing 21 may include an interim portion 75, shown partially in phantom in FIG. 2, with openings 77 therein (only three being shown in FIG. 2), each designed to accommodate one of the mesh contact elements. Such an interim portion 75 must of course possess a thickness much less than the initial spacing between substrates 17 and 25 prior to device 13 engagement to enable an effective amount of downward free movement of substrate 25. Perhaps a preferred embodiment is to utilize such an interim portion 75 which both assures contact alignment in a free-floating manner, while also preventing the contacts from escaping these confines. Portion 75 will thus be the determinant of the z-height compression (and the maximum load) of the compressible contacts. In such an arrangement, it is unlikely that solder will be used to secure one of the contact ends, as suggested for the above, earlier embodiment. It may also be desirable to utilize some form of clamping structure (not shown) to secure the substrate 25 onto housing 21. This clamping structure need not hold contacts 71 in compression, but used to these parts in so that the individual using the invention may more easily position it onto the next image (pattern of contact sites) on substrate 13 to be tested.

Figure 3:
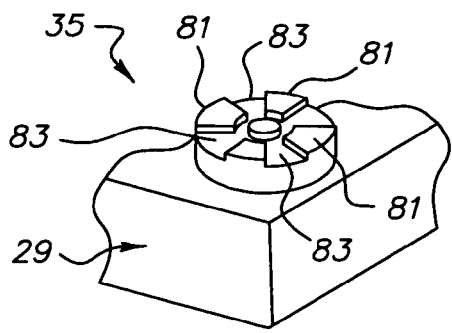
FIG. 3 is a much enlarged view over the view of FIG. 2, is in perspective and illustrates one embodiment of a sculpted contact member usable in the present invention.

A significant feature of the present invention is the use of sculpted contact members 35 for effectively engaging the corresponding contact sites of device 13. An enlarged view of one of these contact members 35 is shown in FIG. 3. As defined above, the term "sculpted" will mean that each contact member 35 will typically include grooves, slots or similar indentations therein, but not a rounded domed shape or other shape having an entirely smooth, uninterrupted exterior surface. This contact, as mentioned, is capable of penetrating, albeit perhaps only partially, the surface of a contact site of such a device. In the case of semiconductor chips, these contact sites are typically solder balls or the like solder elements coupled to individual flat pads (e.g., aluminum, copper) on the chip's undersurface. Contact members 35 as taught herein are able to partially penetrate such solder to assure effective connection thereto (and thus to the chip itself). As seen in FIG. 3, member 35 includes a plurality of upstanding, relatively flat segments 81 (five are shown in FIG. 3 but more or less may be provided) separated by a plurality of grooves 83 (four also shown in FIG. 3). In one example, contact 35 has an overall thickness of only about one mil, with each upstanding segment 81 being 0.6 mils high. As also seen in FIG. 3, contact 35 is of annular configuration, similar to the typical configuration of the undersurface of the solder elements 41. Contact 35 may also be rectangular in shape and segments 81 of a pointed nature where the final shape of the contact pad 35 resembles a crown. The use of sculpted contact members in the structure as shown eliminates the need for an interim flexible interposer. The invention thus uniquely enables separable connection between chip and testing apparatus in a facile manner, yet while assuring the much needed precise connection between highly dense patterns of conductors.

Thus there has been shown and described both an interposer and a test apparatus using same which is capable of effectively testing highly dense patterns of conductors such as typically found on semiconductor chips and the like electronic devices. The structure as described is of robust construction and of materials conventionally known in the art. It is also capable of being assembled in a relatively easy manner, thereby further assuring a relatively low cost final product.

While there have been shown and described what are at present the preferred embodiments of the invention, it will obvious to those skilled in the art that various changes and modifications may be made therein without departing from the scope of the invention as defined by the appended claims.

What is claimed is:

1. An interposer for interconnecting an electronic device and a circuitized substrate, said interposer comprising:
    a housing to be positioned on a host circuitized substrate including a plurality of host conductor pads;
    a first circuitized substrate positioned within said housing and including a first plurality of contact pads of a first density, selected ones of said first plurality of contact pads of said first circuitized substrate for engaging respective ones of said host conductor pads of said host circuitized substrate; and
    a second circuitized substrate positioned on said first circuitized substrate and electrically coupled thereto forming an integral unit, said second circuitized substrate for engaging an electronic device including a plurality of contact sites thereon of a second density different than said first density of said first plurality of contact pads of said first circuitized substrate, said second circuitized substrate including a first plurality of sculpted contact members of a density similar to said second density of said contact sites of said electronic device,
    selected ones of said first plurality of sculpted contact members of said second circuitized substrate for engaging respective ones of said contact sites of said electronic device when said electronic device is positioned on said second circuitized substrate, said first circuitized substrate including a plurality of conductive lines therein which intercouple said selected ones of said first plurality of contact pads of said first circuitized substrate to said selected ones of said first plurality of contact members of said second circuitized substrate.

2. The interposer of claim 1 wherein said housing includes a cavity therein, said first circuitized substrate being movably positioned within said cavity of said housing.

3. The interposer of claim 2 wherein said cavity is of substantially rectangular configuration.

4. The interposer of claim 1 wherein said first circuitized substrate includes a second plurality of contact pads located on an opposite side of said first circuitized substrate from said first plurality of contact pads, selected ones of said plurality of conductive lines electrically interconnecting selected ones of said contact pads of said first plurality of contact pads to selected ones of said contact pads of said second plurality of contact pads.

5. The interposer of claim 4 wherein said second circuitized substrate includes a second plurality of contact members located on an opposite side of said second circuitized substrate from said first plurality of contact members and a plurality of conducting lines interconnecting selected ones of said contact members of said first plurality of contact members with selected ones of said contact members of said second plurality of contact members, said second plurality of contact members not being sculpted.

6. The interposer of claim 5 wherein said second plurality of contact members located on said opposite side of said second circuitized substrate from said first plurality of contact members are also of a density similar to said second density of said contact sites of said electronic device.

7. The interposer of claim 5 wherein said conducting lines interconnecting said first and second pluralities of contact members are thru-holes.

8. The interposer of claim 5 wherein said second plurality of contact pads located on said opposite side of said first circuitized substrate from said first plurality of contact pads are electrically coupled to said second plurality of contact members located on said opposite side of said second circuitized substrate from said first plurality of contact members.

9. The interposer of claim 8 further including a plurality of interconnecting contacts, selected ones of said plurality of interconnecting contacts interconnecting selected ones of said second plurality of contact members of said second circuitized substrate to selected ones of said second plurality of contact pads of said first circuitized substrate.

10. The interposer of claim 9 wherein said interconnecting contacts are solder balls.

11. A test assembly for testing an electronic device, said test assembly comprising:
a host circuitized substrate including a plurality of host conductor pads;
a housing positioned on said host circuitized substrate substantially over said plurality of host conductor pads;
a first circuitized substrate positioned within said housing and including a first plurality of contact pads of a first density, selected ones of said first plurality of contact pads of said first circuitized substrate for engaging respective ones of said host conductor pads of said host circuitized substrate; and
a second circuitized substrate positioned on said first circuitized substrate and electrically coupled thereto, forming an integral unit, said second circuitized substrate for engaging an electronic device including a plurality of contact sites thereon of a second density different than said first density of said first plurality of contact pads of said first circuitized substrate, said second circuitized substrate including a first plurality of sculpted contact members of a density similar to said second density of said electronic device, selected ones of said first plurality of sculpted contact members of said second circuitized substrate for engaging respective ones of said contact sites of said electronic device when said electronic device is positioned on said second circuitized substrate, said first circuitized substrate including a plurality of conductive lines therein which intercouple said selected ones of said first plurality of contact pads of said first circuitized substrate to said selected ones of said first plurality of contact members of said second circuitized substrate such that testing of said electronic device occurs while said electronic device is positioned on said second circuitized substrate and said test assembly is in operation.

12. The test assembly of claim 11 wherein said housing includes a cavity therein, said first circuitized substrate being movably positioned within said cavity of said housing.

13. The test assembly of claim 11 including a plurality of pins, said pins aligning said housing on said host circuitized substrate.

14. The test assembly of claim 11 wherein said host circuitized substrate comprises a printed circuit board.

15. The test assembly of claim 11 further including a plurality of compressible mesh members, selected ones of said compressible mesh members interconnecting selected ones of said first plurality of contact pads of said first circuitized substrate to selected ones of said host conductor pads of said host circuitized substrate.

16. The test assembly of claim 15 wherein said housing includes a plurality of openings therein, each of said compressible mesh members being positioned within said openings within said housing.

17. The test assembly of claim 11 wherein said first circuitized substrate includes a second plurality of contact pads located on an opposite side of said first circuitized substrate from said first plurality of contact pads, selected ones of said plurality of conductive lines electrically interconnecting selected ones of said contact pads of said first plurality of contact pads to selected ones of said contact pads of said second plurality of contact pads.

18. The test assembly of claim 17 wherein said second circuitized substrate includes a second plurality of contact members located on an opposite side of said second circuitized substrate from said first plurality of contact members and a plurality of conducting lines interconnecting selected ones of said contact members of said first plurality of contact members with selected ones of said contact members of said second plurality of contact members, said second plurality of contact members not being sculpted.

19. The test apparatus of claim 17 wherein said second plurality of contact pads located on said opposite side of said first circuitized substrate from said first plurality of contact pads are electrically coupled to said second plurality of contact members located on said opposite side of said second circuitized substrate from said first plurality of contact members.

20. The test apparatus of claim 19 further including a plurality of interconnecting contacts, selected ones of said plurality of interconnecting contacts interconnecting selected ones of said second plurality of contact members of said second circuitized substrate to selected ones of said second plurality of contact pads of said first circuitized substrate.

21. The test apparatus of claim 17 wherein said second plurality of contact members located on said opposite side of said second circuitized substrate from said first plurality of contact members are also of a density similar to said second density of said contact sites of said electronic device.

22. The test apparatus of claim 21 wherein said conducting lines interconnecting said first and second pluralities of contact members are thru-holes.

* * * * *